US008704557B2

(12) United States Patent
Malmcrona et al.

(10) Patent No.: US 8,704,557 B2
(45) Date of Patent: Apr. 22, 2014

(54) HIGH-SPEED NON-INTEGER FREQUENCY DIVIDER CIRCUIT

(75) Inventors: Adam Malmcrona, Stockholm (SE); Tomas Nylén, Upplands Väsby (SE)

(73) Assignee: Telefonaktiebolaget L M Ericsson (Publ), Stockholm ( * ) Notice: Subject to any disclaimer, the term of this patent is extended or adjusted under 35 U.S.C. 154(b) by 6 days.

(21) Appl. No.: 13/392,663

(22) PCT Filed: Sep. 2, 2009

(86) PCT No.: PCT/SE2009/050990
§ 371 (c)(1),
(2), (4) Date: Feb. 27, 2012

(87) PCT Pub. No.: WO2011/028157
PCT Pub. Date: Mar. 10, 2011

(65) Prior Publication Data
US 2012/0313674 A1     Dec. 13, 2012

(51) Int. Cl.
*H03B 19/00*     (2006.01)

(52) U.S. Cl.
USPC ............ 327/117; 327/114; 327/115; 327/118

(58) Field of Classification Search
USPC ......... 327/115, 116, 117, 118, 355–361, 202, 327/203, 208–212, 218; 377/47, 48; 455/4
See application file for complete search history.

(56) References Cited

U.S. PATENT DOCUMENTS 6,535,037 B2 *   3/2003   Maligeorgos ................ 327/116
7,417,486 B2 *   8/2008   Koutani et al. ............... 327/359

(Continued)

FOREIGN PATENT DOCUMENTS

EP     1562294 A1    8/2005
WO   2007109743 A2   9/2007

OTHER PUBLICATIONS

Zhao, B. et al. "A 1.41-1.72 GHz sigma-delta fractional-N frequency synthesizer with a PVT insensitive VCO and a new prescaler." Analog Integrated Circuits and Signal Processing, Dec. 12, 2008, pp. 265-273, vol. 59, Issue 3, Springer Science + Business Media.

(Continued)

*Primary Examiner* — Lincoln Donovan
*Assistant Examiner* — Brandon S Cole
(74) *Attorney, Agent, or Firm* — Murphy, Bilak & Homiller, PLLC (57) ABSTRACT

The invention relates to a high-speed non-integer frequency divider circuit for use in generating frequencies in a communication device, comprising: at least four bi-stable memory devices each having an input terminal, a clock terminal and an output terminal for outputting an output signal. The high-speed non-integer frequency divider circuit is characterized in that the at least four bi-stable memory devices are arranged in a cascaded chain such that each bi-stable memory device following the first bi-stable memory device receives the output signal of a previous bi-stable memory device in the cascaded chain at its input terminal and such that at least one of the output signals of the last bi-stable memory device is used to control the input terminal of the first bi-stable memory device, and in that the frequency divider circuit further comprises a clocking arrangement adapted to provide an in-phase clock signal, a quadrature clock signal, an inverse of the in-phase clock signal and an inverse of the quadrature clock signal to the clock terminals of each of the at least four bi-stable memory devices such that a combination of output signals from the at least bi-stable memory devices produces a frequency divided output signal of the frequency divider circuit having a frequency division ratio of fourths of the frequency of the in-phase clock signal. The invention also relates to a frequency synthesizer and a communication device.

12 Claims, 7 Drawing Sheets

(56) References Cited

U.S. PATENT DOCUMENTS

| | | | |
|---|---|---|---|
| 7,508,273 B2* | 3/2009 | Redman-White | 331/16 |
| 2005/0088210 A1 | 4/2005 | Chen | |
| 2005/0156639 A1 | 7/2005 | Choi et al. | |
| 2007/0009077 A1* | 1/2007 | Widerin | 377/64 |
| 2009/0002080 A1 | 1/2009 | Kim | |
| 2010/0134154 A1* | 6/2010 | He | 327/115 |
| 2011/0215843 A1* | 9/2011 | Nyl n | 327/117 |
| 2012/0007638 A1* | 1/2012 | Meng et al. | 327/115 |

OTHER PUBLICATIONS

Gupta, A. S. et al. "A Novel Low Noise Regenerative Divide-by-Four Circuit." IEEE International Frequency Control Symposium and PDA Exhibition, 2002.

Pellerano, S. et al. "A 4.75-GHz Fractional Frequency Divider-by-1.25 with TDC-Based All-Digital Spur Calibration in 45-nm CMOS." IEEE Journal of Solid-State Circuits, vol. 44, No. 12, Dec. 2009.

\* cited by examiner

HIGH-SPEED NON-INTEGER FREQUENCY DIVIDER CIRCUIT

TECHNICAL FIELD

The present invention relates in general to frequency synthesis. In particular, the invention relates to a non-integer frequency divider circuit. Even more particularly, the invention relates to a high-speed non-integer frequency divider circuit. The present invention also relates to a phase-locked loop frequency synthesizer using the non-integer frequency divider circuit, and a communication device using the non-integer frequency divider circuit and/or the phase-locked loop frequency synthesizer.

BACKGROUND

Frequency dividers, or prescalers, may be used for both analogue and digital applications and are essential building blocks in frequency synthesizers. A frequency divider is an electronic circuit that is adapted to receive an input clock signal with a reference frequency, $f_{ref}$, and generate an output clock signal with a frequency, $f_{out}$, that is a fraction of the reference frequency, $f_{ref}$, of the input clock signal:

$$f_{out} = \frac{f_{ref}}{n}.$$

Most frequency dividers are integer dividers. Integer frequency dividers have a frequency division ratio of n=2, 3, 4, ..., N. An example of an integer frequency divider circuit is the divide-by-2 frequency divider circuit shown in FIG. 1. However, it is particularly interesting to realize non-integer frequency dividers. A non-integer frequency divider may also be referred to as a fractional frequency divider. This is because non-integer frequency dividers increase the flexibility in the choice of which reference frequency the input clock signal must have in order to generate a given output frequency. A non-integer digital frequency divider circuit comprising an arrangement of multiple master-slave flip-flops adapted to achieve frequency division ratios of fourths, that is, n=1.25, 1.5, 1.75, ..., $$\frac{N}{4}$$

is disclosed in European patent application EP 1 562 294 A1. However, a disadvantage with this non-integer digital frequency divider circuit is that it is not fast enough for high-speed applications and may create spurious frequencies (or spurs) in the output due to its inherent non-symmetric configuration.

The speed of a circuit can be calculated by checking its critical path. The critical path of a circuit can be described as the longest path through asynchronous logic between sequential storage elements sharing a common clock signal, e.g. bi-stable memory devices such as flip-flops and/or latches. Since the speed of any circuit is generally limited by the longest delay along its paths, the maximum allowed delay along the critical path of a circuit is a useful metric of the performance of the circuit. For the non-integer digital frequency divider circuit disclosed in European patent application EP 1 562 294 A1, a critical path can be identified as the path from the output of the data latch L4 through the data latch L8 and the NAND-gates 6 and 7. This introduces a maximum allowed delay for the digital frequency divider circuit of a ¼ of the period of the input clock signal. This maximum allowed delay along with the non-symmetric digital circuit configuration limits the speed and performance of the non-integer digital frequency divider circuit.

SUMMARY

A problem to which various embodiments of the invention relate is how to achieve a fast non-integer frequency divider circuit with an improved performance.

This problem is addressed by a non-integer frequency divider circuit according to the independent claim 1. Advantageous embodiments and other advantageous aspects are defined in the claims, which refer to claim 1 either directly or indirectly.

According to an aspect of the present invention, there is provided a non-integer frequency divider circuit, hereinafter referred to as a high-speed non-integer frequency divider circuit, for use in generating frequencies in a communication device. The high-speed non-integer frequency divider circuit comprises: at least four bi-stable memory devices, each having an input terminal, a clock terminal and an output terminal for outputting an output signal, wherein the at least four bi-stable memory devices are arranged in a cascaded chain such that each bi-stable memory device following the first bi-stable memory device receives the output signal of a previous bi-stable memory device in the cascaded chain at its input terminal and such that at least one of the output signals of the bi-stable memory devices is used to control the input terminal of the first bi-stable memory device, and wherein the frequency divider circuit further comprises a clocking arrangement adapted to provide an in-phase clock signal, a quadrature clock signal, an inverse of the in-phase clock signal and an inverse of the quadrature clock signal to the clock terminals of each of the at least four bi-stable memory devices such that a combination of output signals from the at least four bi-stable memory devices produces a frequency divided output signal of the frequency divider circuit having a frequency division ratio of fourths of the frequency of the in-phase clock signal.

By appropriately providing quadrature input clock signals to the clock terminals of the bi-stable memory devices arranged in a cascaded chain configuration and appropriately logically gating the outputs of the bi-stable memory devices, various embodiments of the invention are able to provide a high-speed non-integer frequency divider circuit that is capable of achieving division ratios of fourths of an input clock signal with an improved performance and fast enough for high-speed applications.

The symmetrical configuration of the high-speed non-integer frequency divider circuit introduces a critical path which goes from the clock terminal of one bi-stable memory device to the input terminal of the next bi-stable memory device. This provides a short or very short critical path or shallow gate depth. This short or very short critical path enables a maximum allowed delay that is ½ or ¾ of the period of the input clock signal. This, in turn, allows the high-speed non-integer frequency divider circuit according to some embodiments of the invention to reach higher operating frequencies than other non-integer frequency divider circuit available in the prior art. However, the timing requirement on the critical path will depend on the chosen provided clocking sequence and the desired frequency division ratio, and is set by the phase relationship between the clock signals of two adjacent bi-stable memory devices.

Another advantage of some embodiments of the invention is that the symmetrical structure also minimizes the possibility of generating undesired sub-frequencies in the high-speed non-integer frequency divider circuit output signal which may occur due to non-symmetries of the clock signal paths in the high-speed non-integer frequency divider circuit. This advantageously provides a significant improvement of the performance of the high-speed non-integer frequency divider circuit.

In the high-speed non-integer frequency divider circuit, a combination of the output signals from the at least four bi-stable memory devices in order to produce the frequency divided output signal of the frequency divider circuit may be performed by combinational logic. The combinational logic may, for example, be a logical OR gate logically gating chosen output signals. This advantageously provides a simple logical gating of the output signals from the bi-stable memory devices, and also adds to the performance of the high-speed non-integer frequency divider circuit.

The high-speed non-integer frequency divider circuit may further comprise a second combinational logic circuit. This has the advantage of making the high-speed non-integer frequency divider circuit more fail-safe. This means that the high-speed non-integer frequency divider circuit will always or almost always recover to the desired state after e.g. start-up or a disturbance. The second combinational logic circuit may be a circuit arranged to input a logical "1" to the input terminal of the first bi-stable memory device as all except the last of the output signals from the bi-stable memory devices are logical "0". In order to do so, the second combinational logic circuit may comprise combinational logic that may be arranged to be connected between at least the main part of the output signals of the bi-stable memory devices and the input signal of the first bi-stable memory device. The combinational logic may, for example, be a logical NOR gate. This advantageously provides a very simple and non-complex logical gating of the output signals from the bi-stable memory devices, and also adds to the performance of the high-speed non-integer frequency divider circuit.

The use of a second combinational logic circuit in the high-speed non-integer frequency divider circuit also adds another critical path from the clock terminal of one bi-stable memory device, through the NOR-gate (or combinational logic, etc.) of the second combinational logic circuit to the input terminal of the first bi-stable memory device. The timing requirement on this critical path will also depend on the chosen clocking sequence and the desired frequency division ratio, and is set by the phase relationship between the clock terminals of the bi-stable memory devices coupled to, e.g. the NOR-gate, and the input terminal of the first bi-stable memory device. Even the addition of this critical path to the high-speed non-integer frequency divider circuit still enables a maximum allowed delay that is ½ of the period of the input clock signal.

According to one embodiment of the invention, the non-integer frequency divider circuit may include a total number of 4 bi-stable memory devices when being arranged to produce a frequency divided output signal of the frequency divider circuit having a frequency division ratio of 1.5. Furthermore, the non-integer frequency divider circuit may include a total number of 8 bi-stable memory devices when arranged to produce a frequency divided output signal of the frequency divider circuit having a frequency division ration of 1.25 or 1.75.

The clocking arrangement of the high-speed non-integer frequency divider circuit may thus be adapted to, for a division ratio of 1.25, provide the in-phase and quadrature clock signals to the clock terminals of the bi-stable memory devices in the following cyclical sequence +I, −Q, +Q, +I, −I, +Q, −Q, −I, respectively; or, a division ration of 1.5, provide the in-phase and quadrature clock signals to the clock terminals of the bi-stable memory devices in the following cyclical sequence +I, −Q, −I, +Q, respectively; or, for a division ratio of 1.75, provide the in-phase and quadrature clock signals to the clock terminals in the following cyclical sequence +I, +I, −Q, −Q, −I, −I, +Q, +Q, respectively.

The bi-stable memory devices of the non-integer frequency divider circuit above may for example comprise flip-flops or suitable combinations of flip-flops and latches, etc.

BRIEF DESCRIPTION OF THE DRAWINGS

The objects, advantages and effects as well as features of various embodiments of the invention will be more readily understood from the following detailed description of exemplary embodiments of the invention when read together with the accompanying drawings, in which.

DETAILED DESCRIPTION

Figure 1:
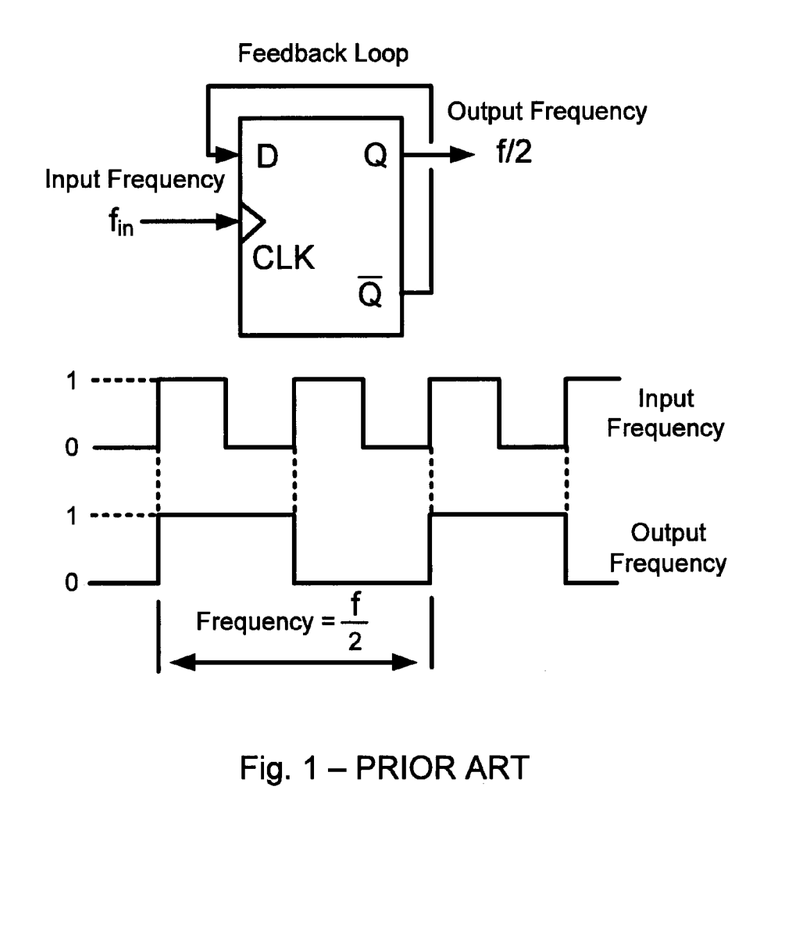
FIG. 1 is a block diagram of an integer frequency divider circuit according to prior art.

FIG. 1 is a block diagram of an integer frequency divider circuit according to prior art. FIG. 1 is provided to shown the principals behind frequency division. The integer frequency divider circuit comprises a D-type flip-flop. The D-type flip-flop in FIG. 1 may also be referred to as a binary divider or a "divide-by-2" counter.

The D-type flip-flop comprises a data input terminal D, an input clock terminal CLK, an output terminal Q and an inverted output terminal $\overline{Q}$. The input clock terminal CLK is fed with a signal having an input clock frequency, $f_{in}$. This produces output signals at the output terminal Q and the inverted output terminal $\overline{Q}$. The inverted output terminal $\overline{Q}$ is connected directly back to the data input terminal D in a feedback loop. This will results in an integer frequency divider circuit that toggles from one state to a second state and vice versa, i.e. HIGH to LOW or LOW to HIGH, at every clock cycle of the input clock frequency, $f_{in}$. It can be seen from the frequency waveforms in FIG. 1, that by feeding back the inverted output signal from the inverted output terminal $\overline{Q}$ to the data input terminal D, the output signal of the output terminal Q will have an output frequency ($f_{in}/2$) that is exactly one half of that of the input clock frequency, $f_{in}$. In other words, the integer frequency divider circuit produces frequency division as it divides the input clock frequency, $f_{in}$, by a factor of two.

It should also be noted that by connecting two of the D-type flip-flop in series, wherein the inverted output signal from the inverted output terminal $\overline{Q}$ of a first flip-flop is fed to the input clock terminal CLK of the second flip-flop, the initial input clock frequency, $f_{in}$, will be "divided-by-two" by the first flip-flop ($f_{in}/2$) and then "divided-by-two" again by the second flip-flop (($f_{in}/2$)/2). This will produce an output signal of the output terminal Q of the second flip-flop which will have an output frequency that is exactly a quarter ($f_{in}/4$) of that of the input clock frequency, $f_{in}$. Thus, in a similar manner by adding additional D-type flip-flops in series, an output signal with an output frequency of $2^n$ where n is the number of flip-flops used in the sequence may be produced.

However, as mentioned above, it is particularly interesting to realize non-integer frequency divider circuits. One advantage of having a non-integer frequency divider circuit is that it increases the flexibility in the choice of which input frequency, $f_{in}$, the input signal to the integer frequency divider circuit must have in order to generate a given output frequency. Unfortunately, the non-integer frequency dividers circuits in the prior art has several disadvantages. The configuration of the non-integer frequency dividers circuits in the prior art are often to complex and prone to errors, which results in non-integer frequency divider circuits that are not fast enough for certain high-speed applications and have a limited or sometimes even poor performance.

According to features of the various embodiments of the invention, these problems can be addressed by appropriately providing quadrature input clock signals to the input terminals of flip-flops arranged in a cascaded chain configuration and logically gating the outputs of the flip-flops appropriately. In doing so, a high-speed non-integer frequency divider circuit is provided that is capable of achieving division ratios of fourths of an input clock signal with an improved performance and fast enough for certain high-speed applications. Advantageous exemplary embodiments of the invention are described in more detail below with reference to FIGS. 2-9.

Figure 2:
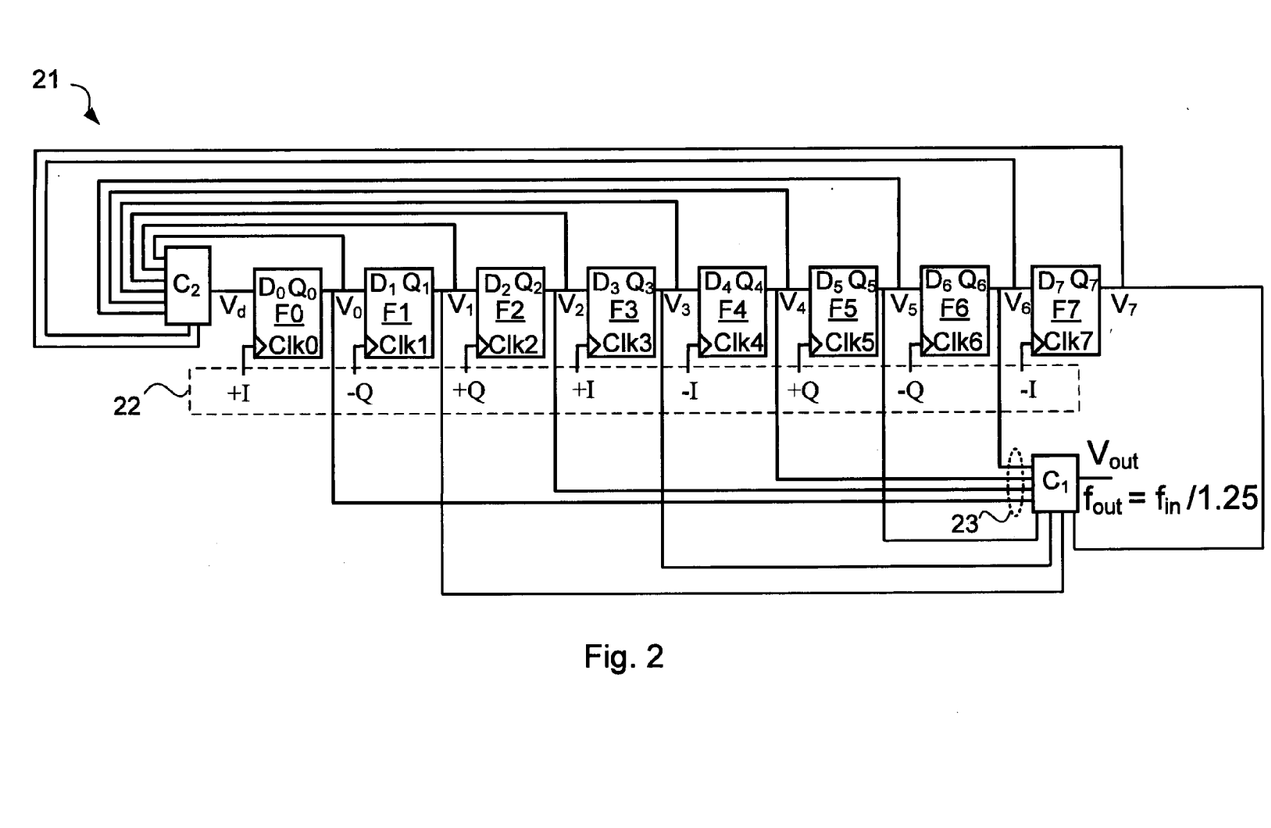
FIG. 2 is a block diagram of a non-integer frequency divider circuit according to an embodiment of the invention.

FIG. 2 is a block diagram of a non-integer frequency divider circuit 21 according to an embodiment of the invention. The non-integer frequency divider circuit 21 is adapted to provide a division ratio of 1.25, that is, for each 5 input clock cycles of the input signal to the non-integer frequency divider circuit 21 provide an output signal of the non-integer frequency divider circuit 21 comprising 4 output clock cycles. This is further illustrated by the signalling diagram in FIG. 3. The non-integer frequency divider circuit 21 comprises an arrangement of 8 bi-stable memory devices F0-F7 which is adapted to receive input clock signals from a clocking arrangement 22 and deliver the output signals from the 8 bi-stable memory devices F0-F7 to a logical circuit $C_1$. In this embodiment, the 8 bi-stable memory devices comprise 8 flip-flops F0-F7. However, it should also be noted that one out of every two flip-flops F0-F7 (e.g. F0, F2, F4 and F6 for the clock sequence described below) may be replaced by another bi-stable memory device, such as, for example, a latch, and still enable the frequency divider circuits 21 to provide the same functionality as described below. A flip-flop can be described as a bi-stable memory device with edge triggering, and a latch as a bi-stable memory device with level sensitive triggering. Also, a flip-flop can also be described as basically two serially coupled latches which are clocked out of phase.

In the flip-flop arrangement, each flip-flop F0-F7 has a data input terminal $D_0$-$D_7$, a clock terminal Clk0-Clk7 and an output terminal $Q_0$-$Q_7$. Each flip-flop F0-F7 is arranged to produce an output signal $V_0$-$V_7$ which is outputted through its output terminal $Q_0$-$Q_7$. The flip-flops F0-F7 are coupled to each other in a cascaded chain. The cascaded chain is arranged such that each subsequent flip-flop F1-F7 in the cascaded chain is adapted to receive the output signal $V_0$-$V_6$ from the output terminal $Q_0$-$Q_6$ of a previous flip-flop F0-F6 at its data input terminal $D_1$-$D_7$, respectively. The clock terminal Clk0-Clk7 of each of the flip-flops F0-F7 is arranged to receive a clock signal from a clocking arrangement 22 described in the following.

From the cascaded chain of flip-flops F0-F7, the output signals $V_0$-$V_7$ from the output terminals $Q_0$-$Q_7$ may be provided to a logical circuit $C_2$. The logical circuit $C_2$ may be arranged to receive the output signals $V_0$-$V_7$ from the output terminal $Q_0$-$Q_7$ of the flip-flops F0-F7. Thus, the logical circuit $C_2$ may combine the received output signals $V_0$-$V_7$ and produce, according to its combinational logic, an output signal $V_d$. The output signal $V_d$ is provided to the data input terminal $D_0$ of the first flip-flop F0 in the cascaded chain.

The logical circuit $C_2$ is thus arranged to be connected between the output terminals $Q_0$-$Q_7$ of the flip-flops F0-F7 and the data input terminal $D_0$ of the first flip-flop F0. The combinational logic of the logical circuit $C_2$ may be arranged to form a second combinational logic circuit (as will be discussed further in the following), or be arranged to simply direct the output signal $V_7$ of the last flip-flop F7 to the input terminal $D_0$ of the first flip-flop F0, i.e. $V_d = V_7$.

Figure 3:
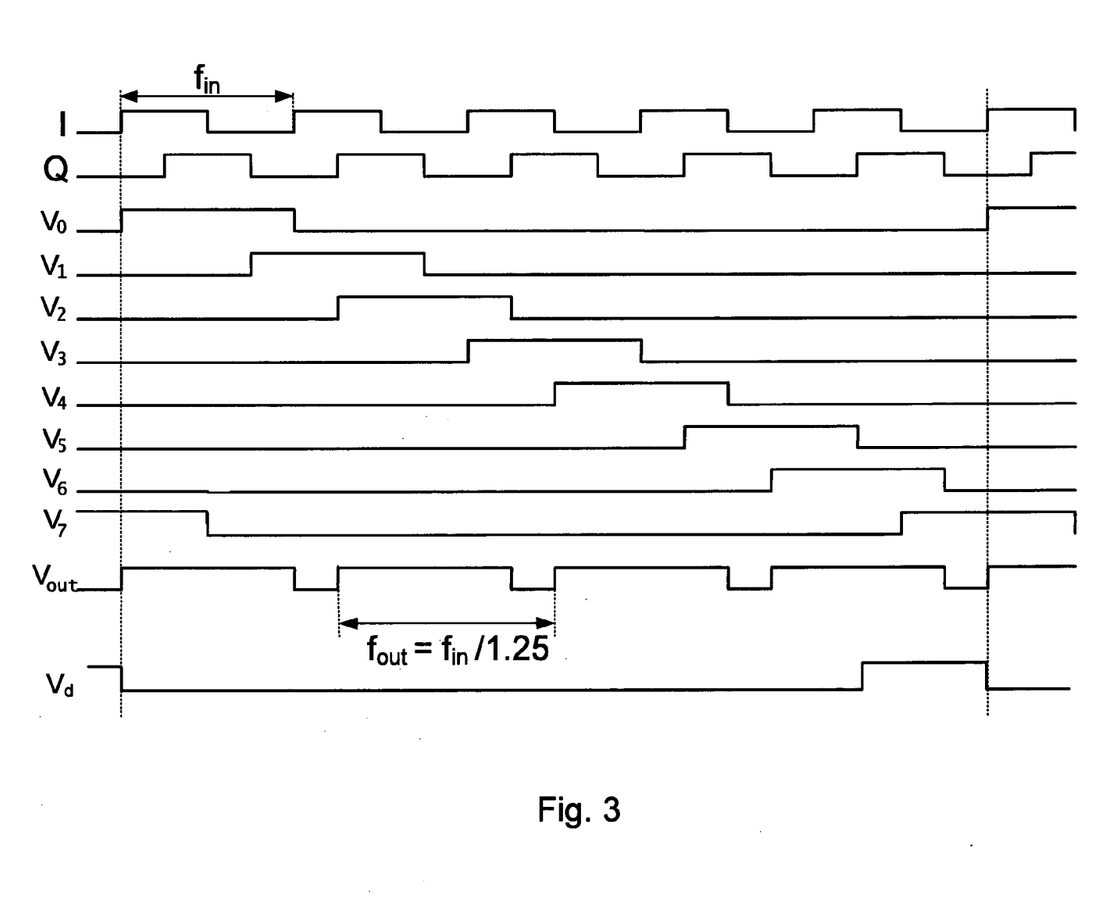
FIG. 3 is a timing chart of the signal waveforms in the non-integer frequency divider circuit according to the embodiment of the invention shown in FIG. 2.

Also from the cascaded chain of flip-flops F0-F7, the output signals $V_0$-$V_7$ from the output terminals $Q_0$-$Q_7$ of the flip-flops F1-F7 are provided to the logical circuit $C_1$. The logical circuit $C_1$ may then suitably combine the received output signals $V_0$-$V_7$ so as to produce an output signal $V_{out}$ with an output period that is five fourths (5/4 or 1.25) of the input period of the reference signal. Thus, the output signal $V_{out}$ will have an output frequency $f_{out}$ which is four fifths (⅘ or 0.8) of the clock frequency, $f_{in}$, of the reference input signal or reference signal. The reference input signal or reference signal referred to is here the in-phase clock signal +I. According to one embodiment, this may for example be performed by combining in the logical circuit $C_1$ every other output signal $V_0$, $V_2$, $V_4$ and $V_6$ (the output signals indicated by the dotted circle 23 in FIG. 2). This means that the output signal $V_0$ from the output terminal $Q_0$ of the first flip-flop F0, the output signal $V_2$ from the output terminal $Q_2$ of the third flip-flop F2, the output signal $V_4$ from the output terminal $Q_4$ of the fifth flip-flop F4 and the output signal $V_6$ from the output terminal $Q_6$ of the seventh flip-flop F6 are selected to be combined in the logic of the logical circuit $C_1$. This may be described by the following logical equation (Eq. 1):

$$V_{out} = V_0 + V_2 + V_4 + V_6 \quad \text{(Eq. 1)}$$

wherein "+" represents the Boolean logical operation OR. This exemplary solution is further illustrated in FIG. 3.

The logical circuit $C_1$ may be any suitable combinational logic adapted to receive the output signals $V_0$-$V_7$ from the arrangement of flip-flops F0-F7 and combine them to achieve the desired output signal, $V_{out}$. A preferable example of such a combinational logic is a logical OR gate or similar logical component. The configuration of the logical circuit $C_1$ may also be arranged so as to, for example, modify the duty cycle of the output signal $V_{out}$. However, in order for the combinational logic $C_1$ to receive output signals which may be combined to form the desired output signal $V_{out}$, it is essential that the clocking arrangement 22 provides an appropriate and suitably timed clocking sequence to the clock terminals Clk0-Clk7 of each of the flip-flops F0-F7 as described below.

The clocking arrangement 22 may comprise suitable connectors or couplings adapted to receive and/or provide quadrature clock signals +I, +Q, −I, −Q to the clock terminals Clk0-Clk7 of each of the flip-flops F0-F7. Alternatively, the clocking arrangement 22 may also comprise a clock unit (not shown) arranged to receive or generate the quadrature clock signals +I, +Q, −I, −Q, and then feed or deliver said quadrature clock signals +I, +Q, −I, −Q to the clock terminals Clk0-Clk7 of each of the flip-flops F0-F7. The quadrature clock signals +I, +Q, −I, −Q consist of an in-phase clock signal +I (also referred to as a reference clock signal or input clock signal), a quadrature clock signal +Q, the inverse of the in-phase clock signal −I, and the inverse of the quadrature clock signal −Q. The clock signals +I, +Q, −I and −Q may also be described as clock signals with a phase offset of 0, 90, 180 and 270 degrees, respectively. The in-phase clock signal +I provide an input frequency, $f_{in}$, to the non-integer frequency divider circuit 21. The in-phase clock signal +I and the quadrature clock signal +Q are also illustrated in the timing chart of FIG. 3. The inverse of the in-phase clock signal −I and the inverse of the quadrature clock signal −Q are not explicitly shown in FIG. 3, but can easily be understood as being the opposite of the clock signal to which it refers.

In an exemplary embodiment, the clocking sequence of the clocking arrangement 22 may appropriately be selected as shown in FIG. 2, i.e. the in-phase clock signal +I is provided to the clock terminals Clk0 and Clk3 of the flip-flops F0 and F3; the quadrature clock signal +Q is provided to the clock terminals Clk2 and Clk5 of the flip-flops F2 and F5; the inverse of the in-phase clock signal −I is provided to the clock terminals Clk4 and Clk7 of the flip-flops F4 and F7; and the inverse of the quadrature clock signal −Q is provided to the clock terminals Clk1 and Clk6 of the flip-flops F1 and F6. It should be noted that the clocking sequences described in this and further embodiments below may not be the only clocking sequences that may selected, but are examples of appropriate clocking sequences that may be used for the non-integer frequency divider according to some embodiments of the invention to operate as intended. It should also be noted that the exemplary clocking sequences described are cyclical, that is, the clocking sequence order +I, −I, +Q, −Q, −I, +I, −Q, +Q, is actually the same as the clocking sequence order +I, −Q, +Q, +I, −I, +Q, −Q, −I.

An advantage of the non-integer frequency divider circuit 21 is that it introduces a critical path which goes from the clock terminal Clk0-Clk7 of one of the flip-flops F0-F7 to the data input terminal $D_1$-$D_7$ of the next flip-flop F1-F7 in the cascaded chain. This advantageously provides a very short critical path or shallow gate depth that result in a maximum allowed delay of ½ of the period of the input clock signal. This, in turn, allows the non-integer frequency divider circuit 21 to reach higher operating frequencies than other non-integer frequency divider circuits available in the prior art. The timing requirement on the critical path of the non-integer frequency divider circuit 21 will depend on the selected clocking sequence of the clocking arrangement 22, here, e.g. +I, −Q, +Q, +I, −I, +Q, −Q, −I, and the desired division ratio, here, e.g. 5/4 or 1.25, and will be set by the phase relationship between the clock signals of two adjacent flip-flops.

Additionally, by having a configuration of the non-integer frequency divider circuit 21 wherein each of the flip-flops F0-F7 share an equal amount of load or delay, a symmetry and regularity can be achieved in the non-integer frequency divider circuit 21. This symmetry and regularity has an advantage in that it will cause the non-integer frequency divider circuit 21 to provide a clean frequency division, i.e. it will minimize the generation of unwanted frequencies. This is because unwanted frequencies (spurious frequencies or spurs) in the output are normally generated in frequency divider circuits by non-symmetries among the different signal paths. The non-symmetric signal paths will lead to the generation of the unwanted frequencies in the output signal, $V_{out}$. Thus, by providing such a symmetrical configuration of a non-integer frequency divider as according to various embodiments of the invention, the unwanted frequencies generated by the non-integer frequency divider will be held at a minimum. The non-integer frequency divider circuit 21 will therefore have an improved performance in view of other prior art frequency dividers. This will also be the case for the non-integer frequency divider circuits 41 and 61 described below.

FIG. 3 is a timing chart of the signal waveforms in the non-integer frequency divider circuit according to the embodiment of the invention shown in FIG. 2. The timing chart shows the signal waveforms of the in-phase clock signal +I, the quadrature clock signal +Q, the output signals $V_0$-$V_7$ from the output terminals $Q_0$-$Q_7$, and the output signal $V_{out}$ from the logical circuit $C_1$ in FIG. 2. The logical circuit $C_1$ outputting the output signal $V_{out}$ may, for example, be a single logical OR gate combining the output signals $V_0$, $V_2$, $V_4$ and $V_6$.

As can be seen from the timing chart, the clocking sequence to the clock terminals Clk0-Clk7 of each of the flip-flops F0-F7 in FIG. 2 and the use of the logical circuit $C_1$, will generate an output signal $V_{out}$ having an output period which is five fourths, 5/4 or 1.25, of the period of the in-phase clock signal +I. It can also be seen that this will generate a duty cycle of about 80/20 for the output signal $V_{out}$. This means that during approximately 80% of the output clock cycle the output signal $V_{out}$ will be "high", or have a value corresponding to a logical "1", and 20% of the output clock cycle the output signal $V_{out}$ will be "low", or have a value corresponding to a logical "0". While a logical OR gate may provide an easy and simple solution, other but more complex combinational gating or logic in the logical circuit $C_1$ in FIG. 2 may allow the generation of other duty cycles (e.g. 60/40, 40/60, 20/80) of the desired output signal, $V_{out}$. For example, a combinational gating or logic of the logical circuit $C_1$ described by the following logical equation (Eq. 2):

$$V_{out}=(V_0 \cdot \overline{V}_1)+(V_2 \cdot \overline{V}_3)+(V_4 \cdot \overline{V}_5)+(V_6 \cdot \overline{V}_7) \qquad \text{(Eq. 2)}$$

wherein "+" represents the Boolean logical operation OR, "·" represents the Boolean logical operation AND, and "$\overline{V}_x$" represents the Boolean logical operation NOT $V_x$, will generate a duty cycle of 60/40 for the output signal $V_{out}$ in FIG. 2. It should be noted that it may be desirable to have as even duty cycle as possible (e.g. 50/50) since this gives an output signal $V_{out}$ that is easier to manage and simplifies the configuration of subsequent components.

Figure 4:
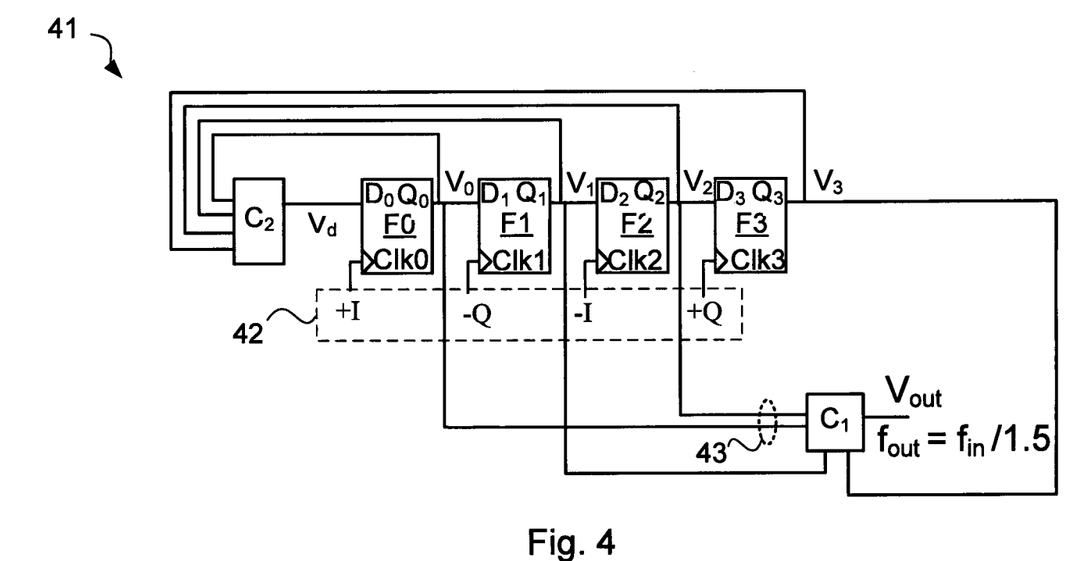
FIG. 4 is a block diagram of a non-integer frequency divider circuit according to another embodiment of the invention.

FIG. 4 is a block diagram of a non-integer frequency divider circuit 41 according to another embodiment of the invention. The non-integer frequency divider circuit 41 is adapted to provide a division ratio of 1.5, that is, for each 3 input clock cycles of the input signal to the non-integer frequency divider circuit 41 provide an output signal of the non-integer frequency divider circuit 41 comprising 2 output clock cycles. This is further illustrated by the signalling diagram in FIG. 5. The non-integer frequency divider circuit 41 comprises an arrangement of 4 bi-stable memory devices F0-F3 which is adapted to receive input clock signals from a clocking arrangement 42 and deliver the output signals $V_0$-$V_3$ from the 4 bi-stable memory devices F0-F3 to a logical circuit $C_1$. In this embodiment, the 4 bi-stable memory devices comprise 4 flip-flops F0-F3.

In the flip-flop arrangement, each flip-flop F0-F3 has a data input terminal $D_0$-$D_3$, a clock terminal Clk0-Clk3 and an output terminal $Q_0$-$Q_3$. Each flip-flop F0-F3 is arranged to produce an output signal $V_0$-$V_3$ which is outputted through its output terminal $Q_0$-$Q_3$. The flip-flops F0-F4 are coupled to each other in a cascaded chain. The cascaded chain is arranged such that each subsequent flip-flop F1-F3 is adapted to receive the output signal $V_0$-$V_2$ from the output terminal $Q_0$-$Q_2$ of a previous flip-flop F0-F2 at its data input terminal $D_1$-$D_3$, respectively. The clock terminal Clk0-Clk3 of each of the flip-flops F0-F3 is arranged to receive a clock signal from the clocking arrangement 42.

From the cascaded chain of flip-flops F0-F3, the output signals $V_0$-$V_3$ from the output terminals $Q_0$-$Q_3$ may be provided to the logical circuit $C_2$. The logical circuit $C_2$ may be arranged to receive the output signals $V_0$-$V_3$ from the output terminal $Q_0$-$Q_3$ of the flip-flops F0-F3. Thus, the logical circuit $C_2$ may combine the received output signals $V_0$-$V_3$ and produce, according to its combinational logic, an output signal $V_d$. The output signal $V_d$ is provided to the data input terminal $D_0$ of the first flip-flop F0 in the cascaded chain. The logical circuit $C_2$ is thus arranged to be connected between the output terminals $Q_0$-$Q_3$ of the flip-flops F0-F3 and the data input terminal $D_0$ of the first flip-flop F0. The combinational logic of the logical circuit $C_2$ may be arranged to form a second combinational logic circuit (described in the following) or be arranged to simply direct the output signal $V_3$ of the last flip-flop F3 to the input terminal $D_0$ of the first flip-flop F0, i.e. $V_d = V_3$.

Figure 5:
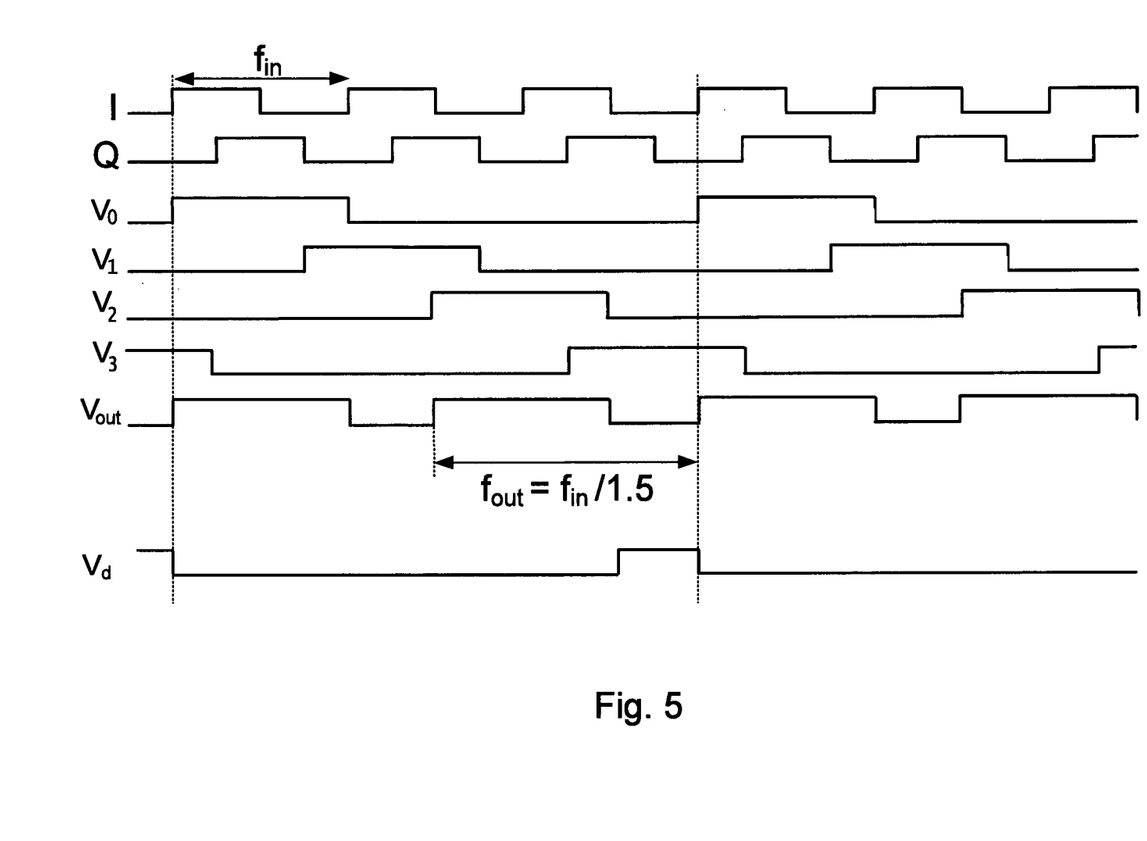
FIG. 5 is a timing chart of the signal waveforms in the non-integer frequency divider circuit according to the embodiment of the invention shown in FIG. 4.

From the cascaded chain of the arrangement of flip-flops F0-F3, the output signals $V_0$-$V_3$ from the output terminals $Q_0$-$Q_3$ of the flip-flops F0-F3 are provided to the logical circuit $C_1$. The logical circuit $C_1$ may then suitably combine the received output signals $V_0$-$V_3$ so as to produce an output signal $V_{out}$ with a output period that is six fourths (6/4 or 1.5) of the input period of the reference signal. Thus, the output signal $V_{out}$ will have an output frequency $f_{out}$ which is four sixths (4/6) of the clock frequency, $f_{in}$, of the reference input signal or reference signal. The reference input signal or reference signal referred to is here the in-phase clock signal +I. According to one embodiment, this may be performed by combining in the logical circuit $C_1$ every other output signals $V_0$ and $V_2$ (i.e. the output signals indicated by the dotted circle 43 in FIG. 4). This means that the output signal $V_0$ from the output terminal $Q_0$ of the first flip-flop F0, and the output signal $V_2$ from the output terminal $Q_2$ of the third flip-flop F2 are selected to be combined in the logic of the logical circuit $C_1$. This may be described by the following logical equation (Eq. 3):

$$V_{out} = V_0 + V_2 \qquad (Eq. 3)$$

wherein "+" represents the Boolean logical operation OR. This exemplary solution is further illustrated in FIG. 5.

The logical circuit $C_1$ may be any suitable combinational logic adapted to receive the output signals $V_0$-$V_3$ from the arrangement of flip-flops F0-F3 and combine them to achieve the desired output signal, $V_{out}$. A preferable example of such a combinational logic is a logical OR gate or similar logical component. However, in order for the combinational logic $C_1$ to receive output signals which may be combined to form the desired output signal $V_{out}$, it is also in this embodiment essential that the clocking arrangement 42 provides an appropriate and suitably timed clocking sequence to the clock terminals Clk0-Clk3 of each of the flip-flops F0-F3 as described below.

The clocking arrangement 42 may comprise suitable connectors or couplings adapted to receive and/or provide quadrature clock signals +I, +Q, −I, −Q to the clock terminals Clk0-Clk3 of each of the flip-flops F0-F3. Alternatively, the clocking arrangement 42 may also comprise a clock unit (not shown) arranged to receive or generate the quadrature clock signals +I, +Q, −I, −Q, and then feed or deliver said quadrature clock signals +I, +Q, −I, −Q to the clock terminals Clk0-Clk3 of each of the flip-flops F0-F3. The quadrature clock signals +I, +Q, −I, −Q have already been described above in relation to the first embodiment of the invention. According to one embodiment, the clocking sequence of the clocking arrangement 22 may appropriately be selected as shown in FIG. 4, i.e. the in-phase clock signal +I is provided to the clock terminal Clk0 of the flip-flop F0; the quadrature clock signal +Q is provided to the clock terminal Clk3 of the flip-flop F3; the inverse of the in-phase clock signal −I is provided to the clock terminal Clk2 of the flip-flop F2; and the inverse of the quadrature clock signal −Q is provided to the clock terminal Clk1 of the flip-flop F1.

As in the non-integer frequency divider circuit 21 in FIG. 2, an advantage of the non-integer frequency divider circuit 41 in FIG. 4 is that it introduces a critical path which goes from the clock terminal Clk0-Clk3 of one of the flip-flops F0-F3 to the data input terminal $D_1$-$D_0$ of the next flip-flop F1-F0 in the cascaded chain. This advantageously provides a very short critical path or shallow gate depth that result in a maximum allowed delay of ¾ of the period of the input clock signal. This, in turn, allows the non-integer frequency divider circuit 41 to reach higher operating frequencies than other non-integer frequency divider circuits available in the prior art. The timing requirement on the critical path of the non-integer frequency divider circuit 41 will depend on the selected clocking sequence of the clocking arrangement 42 (e.g. +I, −Q, −I, +Q) and the desired division ratio (e.g. 6/4 or 1.5), and will be set by the phase relationship between the clock signals of two adjacent flip-flops. Also, by having a configuration of the non-integer frequency divider circuit 41 wherein each of the flip-flops F0-F3 share an equal amount of load, a symmetry and regularity is achieved in the non-integer frequency divider circuit 41. This symmetry and regularity has the advantage in that it will cause the non-integer frequency divider circuit 41 minimize any frequency rest products, i.e. to provide a so-called clean frequency division as previously described.

FIG. 5 is a timing chart of the signal waveforms in the non-integer frequency divider circuit 41 according to the embodiment of the invention shown in FIG. 4. The timing chart shows the signal waveforms of the in-phase clock signal +I, the quadrature clock signal +Q, the output signals $V_0$-$V_3$ from the output terminals $Q_0$-$Q_3$, and the output signal $V_{out}$ from the logical circuit $C_1$ in FIG. 4. The logical circuit $C_1$ outputting the output signal $V_{out}$ may here for example be a single logical OR gate combining the output signals $V_0$ and $V_2$.

As can be seen from the timing chart, the clocking sequence to the clock terminals Clk0-Clk3 of each of the flip-flops F0-F3 in FIG. 4 and the use of, for example, a single logical OR gate as the logical circuit $C_1$, will generate an output signal $V_{out}$ having an output period which is six fourths, 6/4 or 1.5, of the period of the in-phase clock signal +I. It can also be seen that this will generate a duty cycle of 60/40 for the output signal $V_{out}$. This means that during 60% of the output clock cycle the output signal $V_{out}$ will be "high", or have a value corresponding to a logical "1", and 40% of the output clock cycle the output signal $V_{out}$ will be "low", or have a value corresponding to a logical "0". While the logical OR gate provides an easy and simple solution, other but more complex combinational gating or logic in the logical circuit $C_1$ in FIG. 2 may as shown in the previous embodiments allow the generation of other duty cycles of the desired output signal, $V_{out}$.

Figure 6:
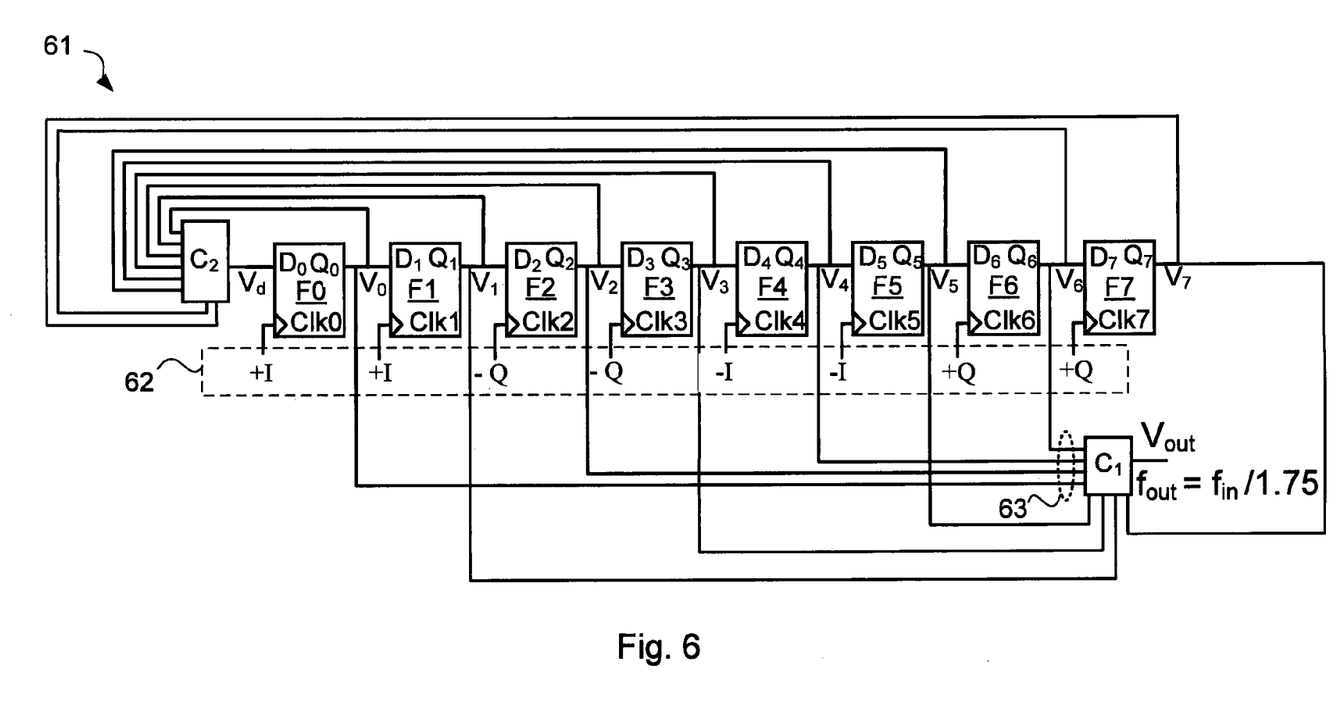
FIG. 6 is a block diagram of a non-integer frequency divider circuit according to a further embodiment of the invention.

FIG. 6 is a block diagram of a non-integer frequency divider circuit 61 according to a further embodiment of the invention. The non-integer frequency divider circuit 61 is adapted to provide a division ratio of 1.75, that is, for each 7 input clock cycles of the input signal to the non-integer frequency divider circuit 61 provide an output signal of the non-integer frequency divider circuit 61 comprising 4 output clock cycles. This is further illustrated by the signalling diagram in FIG. 7. The non-integer frequency divider circuit 61 comprises an arrangement of 8 bi-stable memory devices F0-F7 which is identical to the non-integer frequency divider circuit 21 in FIG. 2, except that the arrangement of 8 bi-stable memory devices F0-F7 is adapted to receive input clock signals from a clocking arrangement 62. The clocking arrangement 62 is arranged to provide a different clocking sequence than the clocking arrangement 22 in the non-integer frequency divider circuit 21 in FIG. 2.

The clocking arrangement 62 may comprise suitable connectors or couplings adapted to receive and/or provide quadrature clock signals +I, +Q, −I, −Q to the clock terminals Clk0-Clk7 of each of the flip-flops F0-F7. Alternatively, the clocking arrangement 62 may also comprise a clock unit (not shown) arranged to receive or generate the quadrature clock signals +I, +Q, −I, −Q, and then feed or deliver said quadrature clock signals +I, +Q, −I, −Q to the clock terminals Clk0-Clk7 of each of the flip-flops F0-F7. The quadrature clock signals +I, +Q, −I, −Q have already been described above in reference to FIG. 1. According to one embodiment, the clocking sequence of the clocking arrangement 62 may be appropriately selected as shown in FIG. 6, i.e. the in-phase clock signal +I is provided to the clock terminals Clk0 and Clk1 of the flip-flops F0 and F1; the quadrature clock signal +Q is provided to the clock terminals Clk6 and Clk7 of the flip-flops F6 and F7; the inverse of the in-phase clock signal −I is provided to the clock terminals Clk4 and Clk5 of the flip-flops F4 and F5; and the inverse of the quadrature clock signal −Q is provided to the clock terminals Clk2 and Clk3 of the flip-flops F2 and F3.

The advantages of the non-integer frequency divider circuit denoted 61 when it comes to improved performance and high speeds are the same as for the non-integer frequency divider circuit denoted 21 in FIG. 2. Also here the timing requirement on the critical path of the non-integer frequency divider circuit 61 will depend on the selected clocking sequence of the clocking arrangement 62, here, +I, +I, −Q, −Q, −I, −I, +Q, +Q, and the desired division ratio, here, 7/4 or 1.75, and is again set by the phase relationship between the clock signals of two adjacent flip-flops.

Figure 7:
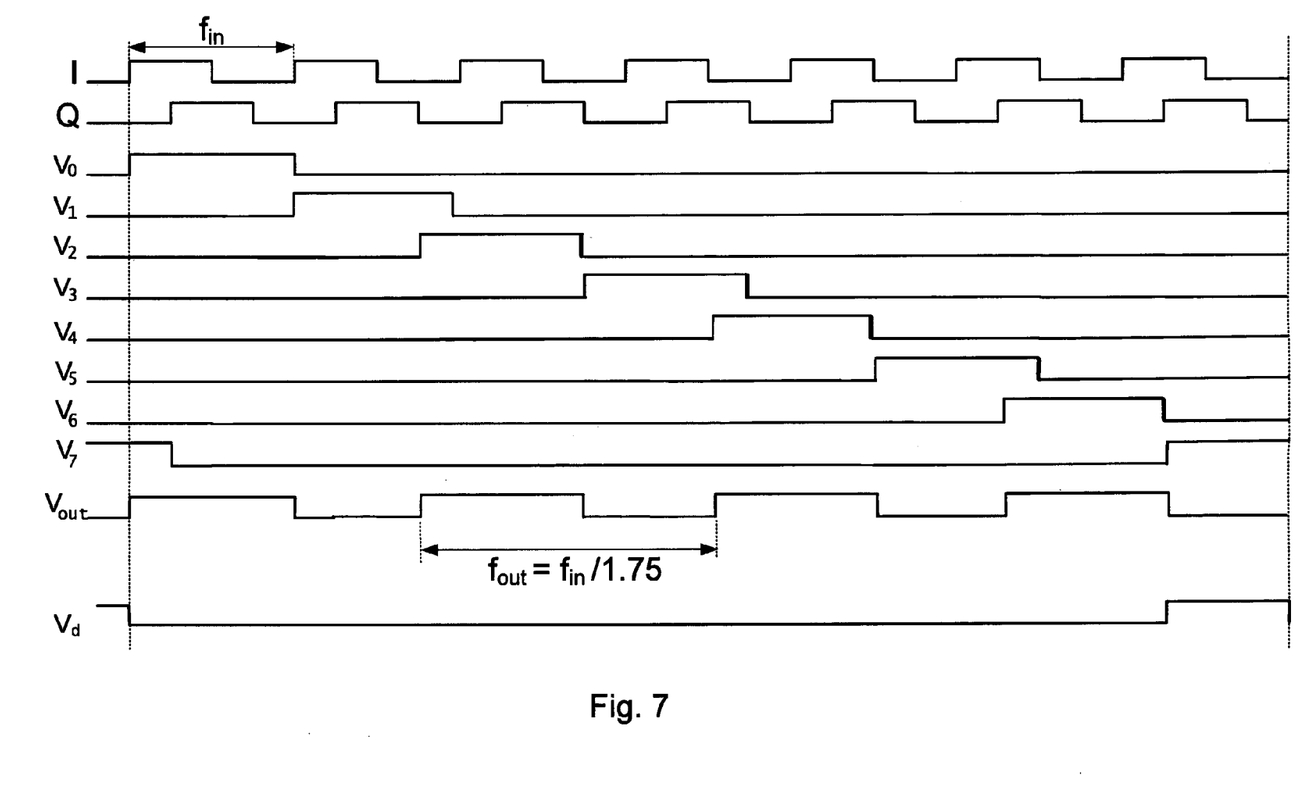
FIG. 7 is a timing chart of the signal waveforms in the non-integer frequency divider circuit according to the embodiment of the invention shown in FIG. 6.

FIG. 7 is a timing chart of the signal waveforms in the non-integer frequency divider circuit according to the embodiment of the invention shown in FIG. 6. The timing chart shows the signal waveforms of the in-phase clock signal +I, the quadrature clock signal +Q, the output signals $V_0$-$V_7$ from the output terminals $Q_0$-$Q_7$, and the output signal $V_{out}$ from the logical circuit $C_1$ in FIG. 2. The logical circuit $C_1$ outputting the output signal $V_{out}$ may here for example be a single logical OR gate combining the output signals $V_0$, $V_2$, $V_4$ and $V_6$ (i.e. the output signals indicated by the dotted circle 63 in FIG. 6).

As can be seen from the timing chart, the clocking sequence to the clock terminals Clk0-Clk7 of each of the flip-flops F0-F7 in FIG. 6 and the use of, for example, a single logical OR gate as the logical circuit $C_1$, will generate an output signal $V_{out}$ having an output period which is seven fourths, 7/4 or 1.75, of the period of the in-phase clock signal +I. It can also be seen that this will generate a duty cycle of about 57/43 for the output signal $V_{out}$. While the logical OR gate provides an easy and simple solution, other but more complex combinational gating or logic in the logical circuit $C_1$ in FIG. 2 may allow the generation of other duty cycles of the desired output signal, $V_{out}$.

It should be understood from the advantageous embodiments above that it is in this way possible to, according to various embodiments of the invention, construct non-integer frequency dividers having any division ratio of fourths of the frequency of an input signal or reference signal, i.e. any division ratio n=1.25, 1.5, 1.75, . . . , $$\frac{N}{4}$$

where N≥5 and is an integer, and which have a symmetrical configuration that provides improved performance and a very short critical path or shallow gate depth that enables the non-integer frequency divider to use higher operating frequencies. Furthermore, as can be seen from the exemplary embodiments above, the number of flip-flops in the non-integer frequency divider circuit according to the various embodiments of the invention may vary depending on the desired division ratio.

As previously mentioned, the logical circuit $C_2$ of the non-integer frequency divider circuits 21, 41, 61 may also be arranged to provide a suitable input $V_d$ (i.e. a sequence of logical ones "1" and zeros "0") to the cascaded chain of bi-stable memory devices in order for the bi-stable memory devices of the non-integer frequency divider circuits 21, 41, 61 to automatically recover to their correct states when having been disrupted. For example, the logical circuit $C_2$ of the non-integer frequency divider circuits 21 in FIG. 2 may be arranged to receive the output signals $V_0$-$V_7$ from the output terminal $Q_0$-$Q_7$ of the flip-flops F0-F7. In this way, the logical circuit $C_2$ may here form a "zero-detection" circuit by being arranged to input a logical "1" to the input terminal $D_0$ of the first flip-flop F0 as all except the last of the received output signals $V_0$-$V_7$ from the flip-flops F0-F7 are logical "0" (as shown by $V_d$ in FIG. 3). All output signals from the flip-flops F0-F7 may actually not necessarily be used by the logic in the logical circuit $C_2$ in order to perform the function of the "zero-detection" circuit. It may however be beneficial to assign dummy loads to the output signals from the flip-flops F0-F7 that are not used by the logical circuit $C_2$ in order to assure that all flip-flops F0-F7 are subjected to an equal load. This advantageously balances and preserves the symmetry and regularity of the non-integer frequency divider circuits 21. For example, this may be implemented by using combinational logic, such as, e.g. a logical NOR gate, of which the functionality may be described according to the following logical equation, Eq. 4:

$$V_d = \overline{(V_0 + V_1 + V_2 + V_3 + V_4 + V_5)} \qquad \text{(Eq. 4)}$$

wherein "+" represents the Boolean logical operation OR, and "$\overline{V_x}$," represents the Boolean logical operation NOT $V_x$. A similar logical operation and functionality may, for example, also be applied to the non-integer frequency divider circuits 41, 61 in FIGS. 4 and 6 in a similar manner according to the logical equations, Eq. 5 and 6, respectively:

$$V_d = \overline{(V_0 + V_1 + V_2)} \qquad \text{(Eq. 5)}$$

$$V_d = \overline{(V_0 + V_1 + V_2 + V_3 + V_4 + V_5 + V_6)} \qquad \text{(Eq. 6)}$$

The function of the logical circuit $C_2$ has the advantage of providing a fail-safe configuration of the non-integer frequency divider circuits 21, 41, 61. By having this functionality, the non-integer frequency divider circuits 21, 41, 61 will always recover to the wanted state on its own. This provides robustness to the non-integer frequency divider circuits 21, 41, 61 against any events that occur which may cause a disruption in the desired states of the flip-flops. Such events may be, for example, during a start-up procedure or if a sudden power surge or similar, e.g. from a lightning strike or similar, has disturbed the normal operation of the non-integer frequency divider circuits 21, 41, 61.

Furthermore, in addition to the previously mentioned critical path, the logical circuit $C_2$ will introduce a second critical path in the non-integer frequency divider circuits 21, 41, 61. For example, in the non-integer frequency divider circuits 21 and 61, this second critical path will go from the clock terminal Clk0-Clk7 of one of the flip-flops F0-F7, through the logical circuit $C_2$, and to the data input terminal $D_0$ of the first flip-flop F0. The timing requirement on this second critical path of the non-integer frequency divider circuits 21 and 61 will depend on the selected clocking sequence of the clocking arrangement 22 and 62, and the desired division ratio, 5/4 (1.25) or 7/4 (1.75), and will be set by the phase relationship between the flip-flops F0-F5 (i.e. the flip-flops whose output signals are used by the logical circuit $C_2$) and the first flip-flop F0.

If the functionality of the logical circuit $C_2$ is not implemented in the non-integer frequency divider circuits 21, 41, 61, it should be noted that it may also be possible to either manually and/or remotely reset the flip-flops (i.e. bi-stable memory devices) back into a wanted state after being subjected to an event which caused a disruption its desired states.

Furthermore, a non-integer frequency divider circuit as described in any of the embodiments above may advantageously be used in a phase-locked loop (PLL) of a frequency synthesizer for generating frequencies that are multiples of a reference input frequency. The PLL may be a relatively general-purpose circuitry such as a programmable logic device (PLD) that may need to support signalling at any frequency in a wide range of frequencies. PLL circuits are implemented in a wide variety of electronic devices including frequency synthesizers for transceivers in various mobile communication devices. PLL circuits are attractive in modulation applications due to their combination of controllable modulation and stable and adjustable carrier frequency.

The description above is of the best mode presently contemplated for practising the various embodiments of the invention. The description is not intended to be taken in a limiting sense, but is made merely for the purpose of describing the general principles of the invention. The scope of the invention should only be ascertained with reference to the issued claims.

The invention claimed is:

1. A non-integer frequency divider circuit for use in generating frequencies in a communication device, comprising:
   at least four bi-stable memory devices, each having an input terminal, a clock terminal and an output terminal for outputting an output signal;
   wherein the at least four bi-stable memory devices are arranged in a cascaded chain, such that each bi-stable memory device following the first bi-stable memory device receives the output signal of a previous bi-stable memory device in the cascaded chain at its input terminal and such that at least one output signals of the bi-stable memory devices is used to control the input terminal of the first bi-stable memory device; and
   wherein the frequency divider circuit further comprises a clocking arrangement configured to provide an in-phase clock signal, a quadrature clock signal, an inverse of the in-phase clock signal, and an inverse of the quadrature clock signal, to the clock terminals of each of the at least four bi-stable memory devices, such that a combination of the output signals from the at least four bi-stable memory devices produces a frequency divided output signal of the frequency divider circuit having a frequency division ratio of fourths of the frequency of the in-phase clock signal.

2. The non-integer frequency divider circuit of claim 1, further comprising a first combinational logic configured to perform the combination of the output signals from the at least four bi-stable memory devices, to thereby produce the frequency divided output signal of the frequency divider circuit.

3. The non-integer frequency divider circuit of claim 2, wherein the first combinational logic is a logical OR gate.

4. The non-integer frequency divider circuit of claim 1, comprising a second combinational logic connected between the output signals of the at least four bi-stable memory devices and the input signal of the first of the at least four bi-stable memory devices and configured to provide an input to the first of the at least four bi-stable memory devices, such that the at least four bi-stable memory devices of the non-integer frequency divider circuit recover to correct states upon disruption.

5. The non-integer frequency divider circuit of claim 4, wherein the second combination logic is configured to as a zero detection circuit that inputs a logical "1" to the input terminal of the first of the at least four bi-stable memory devices responsive to one or more of outputs signals being a logical "0".

6. The non-integer frequency divider circuit of claim 4, wherein the second combinational logic circuit is a logical NOR gate.

7. The non-integer frequency divider circuit of claim 1, comprising a total number of four bi-stable memory devices when configured to produce a frequency divided output signal of the frequency divider circuit having a frequency division ratio of 1.5, and a total number of eight bi-stable memory devices when configured to produce a frequency divided output signal of the frequency divider circuit having a frequency division ratio of 1.25 or 1.75.

8. The non-integer frequency divider circuit of claim 7, wherein the clocking arrangement is configured to:
   for a division ratio of 1.25, provide the in-phase and quadrature clock signals to the clock terminals in the following cyclical sequence +I, −Q, +Q, +I, −I, +Q, −Q, −I, respectively;
   for a division ration of 1.5, provide the in-phase and quadrature clock signals to the clock terminals in the following cyclical sequence +I, −Q, −I, +Q, respectively; or
   for a division ratio of 1.75, provide the in-phase and quadrature clock signals to the clock terminals in the following cyclical sequence +I, +I, −Q, −Q, −I, −I, +Q, +Q, respectively.

9. The non-integer frequency divider circuit of claim 1, wherein the bi-stable memory devices comprises flip-flops.

10. The non-integer frequency divider circuit of claim 1, wherein at least one of the bi-stable memory devices comprises a latch.

11. The non-integer frequency divider of claim 1, wherein the non-integer frequency divider comprises part of a frequency synthesizer that is configured to use the non-integer frequency divider for generating frequencies that are multiples of a reference input frequency.

12. The non-integer frequency divider of claim 1, wherein the non-integer frequency divider comprises part of a communication device that is configured to use the non-integer frequency divider for generating frequencies associated with said communication device transmitting or receiving communication signals.

\* \* \* \* \*

UNITED STATES PATENT AND TRADEMARK OFFICE
CERTIFICATE OF CORRECTION

PATENT NO.        : 8,704,557 B2
APPLICATION NO.   : 13/392663
DATED             : April 22, 2014
INVENTOR(S)       : Malmcrona et al.

Page 1 of 1

It is certified that error appears in the above-identified patent and that said Letters Patent is hereby corrected as shown below:

On the Title Page, in Item (73), under "Assignee", in Column 1, Line 2, delete "Stockholm" and insert -- Stockholm (SE) --, therefor.

In the Specification:

In Column 12, Line 54, delete " $\nabla_{x}$ " and insert -- $\overline{V}_x$ --, therefor.

In Column 14, Line 60, in Claim 11, delete "divider" and insert -- divider circuit --, therefor.

In Column 14, Line 65, in Claim 12, delete "divider" and insert -- divider circuit --, therefor.

Signed and Sealed this
Twenty-eighth Day of October, 2014

Michelle K. Lee
*Deputy Director of the United States Patent and Trademark Office*